(12) United States Patent
Nie et al.

(10) Patent No.: US 12,194,936 B2
(45) Date of Patent: Jan. 14, 2025

(54) COLLISION SEVERITY PREDICTION DEVICE FOR OCCUPANT INJURY RISK

(71) Applicant: TSINGHUA UNIVERSITY, Beijing (CN)

(72) Inventors: Bing-Bing Nie, Beijing (CN); Wen-Tao Chen, Beijing (CN); Qing-Fan Wang, Beijing (CN); Jiajie Shen, Beijing (CN); Quan Li, Beijing (CN); Shengbo Li, Beijing (CN); Qing Zhou, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 355 days.

(21) Appl. No.: 17/705,355

(22) Filed: Mar. 27, 2022

(65) Prior Publication Data

US 2022/0212618 A1 Jul. 7, 2022

Related U.S. Application Data

(63) Continuation of application No. PCT/CN2019/121460, filed on Nov. 28, 2019.

(30) Foreign Application Priority Data

Oct. 16, 2019 (CN) .......................... 201910982338.4

(51) Int. Cl.
  *B60N 2/02* (2006.01)
  *B60N 2/01* (2006.01)
  (Continued)

(52) U.S. Cl.
  CPC ........ *B60R 21/0132* (2013.01); *B60R 16/023* (2013.01); *B60W 30/085* (2013.01);
  (Continued)

(58) Field of Classification Search
  None
  See application file for complete search history.

(56) References Cited

U.S. PATENT DOCUMENTS

| 6,169,945 B1 | 1/2001 | Bachmaier |
| 2005/0010340 A1* | 1/2005 | Peravali .............. B60R 21/0156 702/183 |

(Continued)

FOREIGN PATENT DOCUMENTS

| CN | 103279795 | 9/2013 |
| CN | 103303237 | 9/2013 |

(Continued)

OTHER PUBLICATIONS

International Search Report of PCT/CN2019/121460.
(Continued)

*Primary Examiner* — Jonathan M Dager
*Assistant Examiner* — Laura E Linhardt

(57) ABSTRACT

Disclosed is a method for predicting collision severity, including: establishing a first learning model, and inputting vehicle data and collision accident scene feature data into the first learning model; obtaining a predicted collision acceleration curve outputted by the first learning model, the predicted collision acceleration curve being established based on a plane rectangular coordinate system; establishing a second learning model, and inputting the predicted collision acceleration curve, the occupant feature data and the restraint system feature data into the second learning model; obtaining a plurality of predicted collision kinematics and dynamics curves of human body parts outputted by the second learning model; generating a collision severity parameter according to the plurality of predicted collision (Continued)

kinematics and dynamics curves of the human body parts, the collision severity parameter being configured to evaluate the collision severity.

12 Claims, 3 Drawing Sheets

(51) Int. Cl.
*B60R 16/023* (2006.01)
*B60R 16/037* (2006.01)
*B60R 21/0132* (2006.01)
*B60R 21/015* (2006.01)
*B60R 21/16* (2006.01)
*B60R 22/48* (2006.01)
*B60W 30/085* (2012.01)
*B60W 30/095* (2012.01)
*G06N 20/00* (2019.01)
*B60R 21/013* (2006.01)

(52) U.S. Cl.
CPC ........... *B60W 30/095* (2013.01); *G06N 20/00* (2019.01); *B60R 2021/01315* (2013.01); *B60R 2021/01322* (2013.01); *B60W 2540/227* (2020.02)

(56) References Cited

U.S. PATENT DOCUMENTS

2010/0209890 A1    8/2010   Huang et al.
2013/0054093 A1*   2/2013   Furst .................. B60R 21/0136
                                                                                                                                                             701/45
2022/0089063 A1*   3/2022   Fields ............... B60R 21/01554

FOREIGN PATENT DOCUMENTS

| | | |
|---|---|---|
| CN | 106740864 | 5/2017 |
| CN | 107291972 | 10/2017 |
| CN | 109738205 | 5/2019 |
| CN | 110210090 | 9/2019 |
| CN | 110281924 | 9/2019 |

OTHER PUBLICATIONS

"Simulation Study of Bus Occupant Restraint System in Emergency Brake", GE Ruhai et al., Proceedings of the 9th Annual Academic Conference of Jiangsu of Automotive Engineering, Sep. 1, 2010.

\* cited by examiner

COLLISION SEVERITY PREDICTION DEVICE FOR OCCUPANT INJURY RISK

RELATED APPLICATION

This application claims all benefits accruing under 35 U.S.C. § 119 from China Patent application No. 201910982338.4, filed on Oct. 16, 2019, the content of which is herein incorporated by reference in its entirety. This application is a continuation under 35 U.S.C. § 120 of international patent application PCT/CN2019/121460, entitled "COLLISION SEVERITY PREDICTION METHOD FOR OCCUPANT INJURY RISK", filed on Nov. 28, 2019, the content of which is also hereby incorporated by reference.

TECHNICAL FIELD

The present disclosure relates to the technical field of vehicle accident analysis, and in particular, to a collision severity prediction method for occupant injury risk.

BACKGROUND

At present, the trajectory planning algorithm for vehicle driving is relatively mature in road search and road selection. Common road search algorithms include the Dijkstra's algorithm and the A-Star (A*) algorithm. Usually, the road selected by planning should meet two basic requirements namely feasibility and safety, so as to ensure that the selected road may not only be realized in control, but also ensure driving safety. When there is a safe road among the alternative roads, the collision probability of the road is zero, regardless of whether the collision severity is calculated or not, the collision severity is zero, and in this case, it is meaningless to calculate the collision severity. However, when there is no safe road among the alternative roads, that is, when a traffic accident is inevitable, choosing the road with the comparatively small collision severity is crucial to a reduction of accident injuries.

Calculation in a traditional method for predicting collision severity is generally based on the equivalent energy speed (EES for short). The EES is a physical quantity derived on the basis of the hypothesis that an ego vehicle collides with a surrounding vehicle, in accordance with the energy conservation law and the momentum conservation law, and according to the curb weight of the ego vehicle, the curb weight of the surrounding vehicle, and a relative speed between the ego vehicle and the surrounding vehicle. Specifically, the EES is derived and calculated according to the following formula:

$$EES = \frac{2M_{sur}}{M_{sur} + M_{ego}} \Delta V$$

In the formula, $M_{sur}$ denotes the curb weight of the surrounding vehicle, $M_{ego}$ denotes the curb weight of the ego vehicle, and $\Delta V$ denotes the relative speed between the ego vehicle and the surrounding vehicle. Further, after a plurality of validation is performed on actual vehicles, an empirical relationship between the EES and injury risks of different degrees is established to obtain a collision severity.

However, the traditional method for predicting collision severity has a serious problem: the occupant collision process is oversimplified and the accuracy is low. The collision severity is actually not only determined by one physical quantity namely the EES, but also related to a plurality of factors, such as an initial collision speed, a vehicle configuration, road conditions, using conditions of the restraint system, seated occupant's postures, a seated occupant's position, an occupant's age, an occupant's gender, etc, which will affect a final collision severity prediction result. Therefore, in the traditional scheme, it is inaccurate to predict the collision severity only by means of one physical quantity namely the EES. If the collision severity is predicted and the road is planned based on the traditional method for predicting collision severity, it is difficult to make correct decisions when a traffic accident is inevitable, even the occupant will be in a dangerous situation.

SUMMARY

Bases on this, it is necessary to provide a collision severity prediction method for occupant injury risk in view of the problem that, in the traditional method for predicting collision severity, the occupant collision process is oversimplified and the accuracy of the predicting method is low.

The present disclosure provides the method for predicting collision severity including the following steps.

A first learning model is established, and vehicle data and collision accident scene feature data are inputted into the first learning model.

A predicted collision acceleration curve outputted by the first learning model is obtained, the predicted collision acceleration curve is established based on a plane rectangular coordinate system, an abscissa of the predicted collision acceleration curve presents a Time To Collision (TTC), and an ordinate of the predicted collision acceleration curve represents the collision acceleration.

A second learning model is established, and the predicted collision acceleration curve, the occupant feature data and the restraint system feature data are inputted into the second learning model.

A plurality of predicted collision kinematics and dynamics curves of human body parts outputted by the second learning model are obtained.

The plurality of predicted collision kinematics and dynamics curves of the human body parts are established based on the plane rectangular coordinate system, an abscissa of each of the plurality of predicted collision kinematics and dynamics curves of the human body parts represents the TTC, an ordinate of each of the plurality of predicted collision kinematics and dynamics curves of the human body parts represents a collision kinematics and dynamics parameter of a corresponding human body part.

A collision severity parameter is generated according to the plurality of predicted collision kinematics and dynamics curves of the human body parts, the collision severity parameter is configured to evaluate the collision severity.

The present disclosure relates to the method for predicting the collision severity, by establishing the first learning model and inputting the vehicle data and the collision accident scene feature data into the first learning model to obtain the predicted collision acceleration curve, the road traffic conditions of corresponding road section and the vehicle data may be fully used to calculate the vehicle collision acceleration. By establishing the second learning model, and by inputting the occupant feature data, the restraint system feature data and the predicted collision acceleration curve into the second learning model to obtain the predicted dynamics and kinematics curves of different parts of the human body, the actual collision accident scene features such as the occupant features and the restraint system features may be comprehensively considered, thereby greatly improving the reliability of the collision severity prediction for the occupant. Finally, based on the predicted collision kinematic and dynamics curves of different human body parts, the injury grade score of each part is calculated to realize the quantification of the collision severity. The method for predicting collision severity involved in the present disclosure may realize a fast and accurate collision severity prediction for the occupant under the premise of considering comprehensive factors. In addition, the method for predicting collision severity involved in the present disclosure may be applied to existing trajectory planning algorithms of intelligent vehicles, so as to improve the accuracy of the collision risk prediction, thereby improving road traffic safety.

DETAILED DESCRIPTION OF THE EMBODIMENTS

In order to make the objectives, technical solutions, and advantages of the present application clearer and better understood, the present disclosure will be further described in detail herein. It should be understood that the specific embodiments described herein are only used to illustrate the present disclosure, but not intended to limit the present disclosure.

The present disclosure provides a collision severity prediction method for occupant injury risk, which may further predict an occupant injury risk effectively through predicting the collision severity.

It should be noted that the method for predicting collision severity provided by the present disclosure does not limit its application fields and application scenarios. Optionally, the method for predicting collision severity provided by the present disclosure is applied to a trajectory planning for automatic drive, so as to ensure the safety of trajectory planning for the automatic drive.

An execution subject of the method for predicting collision severity provided by the present disclosure is not limited. Optionally, the execution subject of the method for predicting collision severity may be a device for predicting collision severity. The device for predicting collision severity may be arranged inside the vehicle to be predicted. The device for predicting collision severity may not necessarily be arranged inside the vehicle to be predicted, but may be arranged independently. Optionally, the execution subject may be a processor arranged in the device for predicting collision severity.

Figure 1:
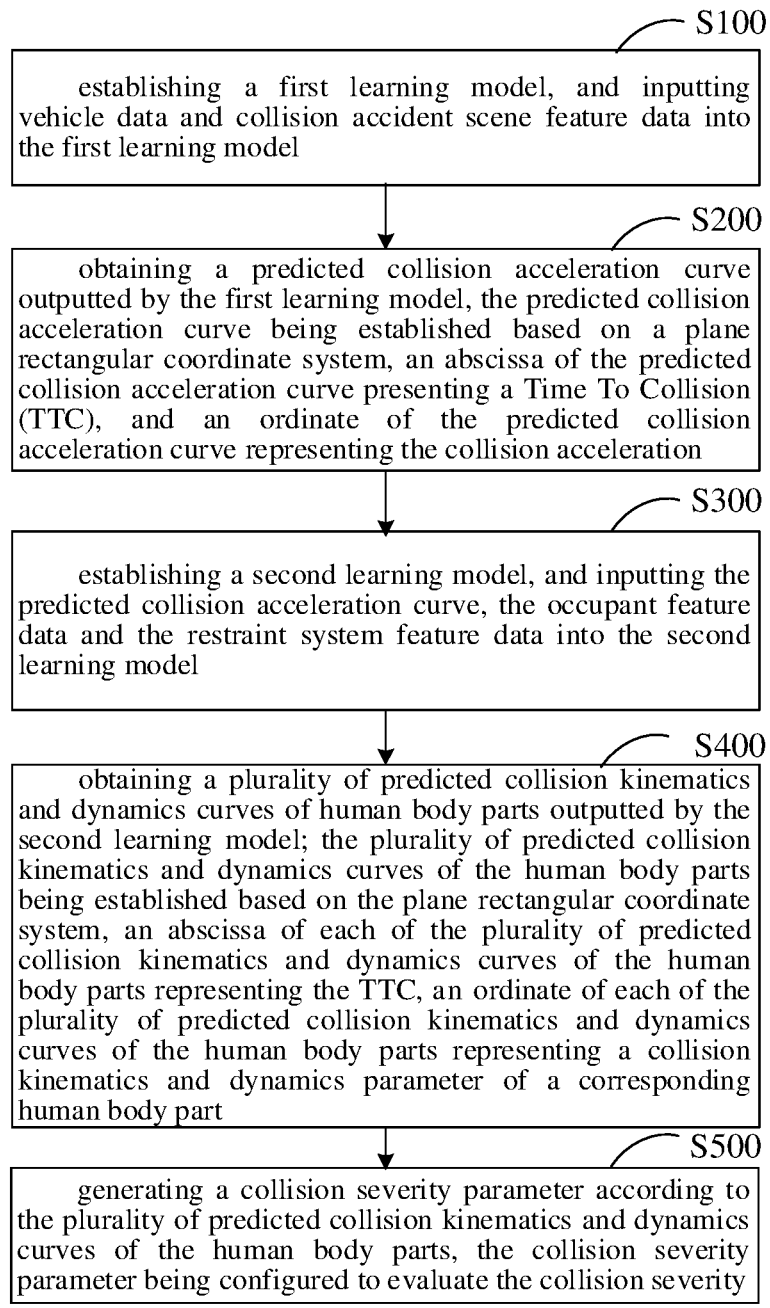
FIG. 1 is a schematic flowchart of a method for predicting collision severity according to an embodiment of the present disclosure.

As shown in FIG. 1, in an embodiment of the present disclosure, the method for predicting collision severity includes the following steps S100 to S500.

At step S100, a first learning model is established, and vehicle data and collision accident scene feature data are inputted into the first learning model.

Specifically, the method for predicting collision severity of the present disclosure is provided to predict the collision severity of the vehicle to be predicted in different planned alternative roads. In the embodiment, the device for predicting collision severity may execute steps S100 to S500 at an interval of a preset time period to predict collision severity for the vehicle to be predicted. Specifically, the time length of the preset time period may be configured to be relatively short, so that the device for predicting collision severity may predict the vehicle to be predicted in real time. Optionally, the preset time period may be configured to be one second.

In the present disclosure, there are a plurality of alternative roads in the trajectory planning scheme. When there is a safe road among the plurality of alternative roads, the collision probability of the road is zero, and regardless of whether the collision severity is calculated or not, the collision severity of the road is zero. In this case, it is meaningless to calculate the collision severity. However, when there is no safe road among the plurality of alternative roads, that is, when a traffic accident is inevitable, choosing the road with the comparatively small collision severity is crucial for reducing accident injuries. Therefore, the collision severity of the alternative road calculated by the present disclosure is based on the default that there must be a phenomenon in the alternative roads that the vehicle to be predicted collides with the surrounding vehicle.

The vehicle data are the data of the vehicle to be predicted. Specifically, the vehicle data includes at least vehicle type data and vehicle structure data. The collision accident scene feature data come from the road conditions in the alternative roads. Specifically, the collision accident scene feature data include one or more of a collision angle, a relative vehicle collision speed, driving road conditions, driving weather conditions, a surrounding vehicle type, and a collision recurrence rate.

At step S200, a predicted collision acceleration curve outputted by the first learning model is obtained. The predicted collision acceleration curve is established based on a plane rectangular coordinate system. The abscissa of the predicted collision acceleration curve presents a Time To Collision (TTC). The ordinate of the predicted collision acceleration curve represents the collision acceleration.

Figure 2:
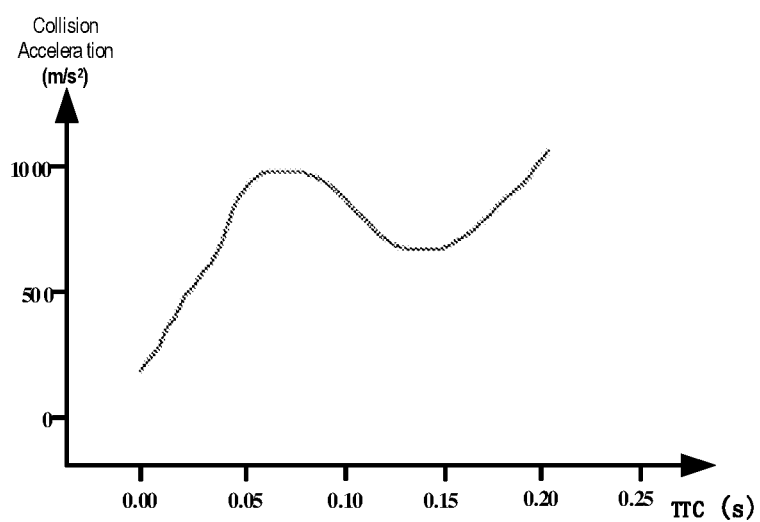
FIG. 2 is a schematic diagram showing a predicted collision acceleration curve involved in the method for predicting collision severity according to an embodiment of the present disclosure.

Specifically, as shown in FIG. 2, the abscissa of the predicted collision acceleration curve represents the TTC. Since the time length of the preset time period is configured to be relatively short, it may be considered that the vehicle to be predicted only collides with one surrounding vehicle. The TTC is a time length counted from a start time of the collision between the vehicle to be predicted and the surrounding vehicle to a terminal time of the collision of the vehicle to be predicted and the surrounding vehicle. The ordinate of the predicted collision acceleration curve represents the collision acceleration of the vehicle to be predicted during the collision between the vehicle to be predicted and the surrounding vehicle.

At step S300, a second learning model is established. Further, the predicted collision acceleration curve, the occupant feature data and the restraint system feature data are inputted into the second learning model.

Specifically, the predicted collision acceleration curve is the data result outputted by the first learning model at the step S200. The occupant feature data are data of the occupant in the vehicle to be predicted. The occupant feature data includes one or more of the occupant's gender, the occupant's age, the occupant's weight, and seated occupant's posture. The restraint system feature data includes one or more of a seat belt configuration status, a seat configuration status, a windshield configuration status, and an airbag configuration status.

At step S400, a plurality of predicted collision kinematics and dynamics curves of human body parts outputted by the second learning model are obtained. The predicted collision kinematics and dynamics curves of the human body parts are established based on the plane rectangular coordinate system. The abscissa of each of the predicted collision kinematics and dynamics curves of the human body parts represents the TTC. The coordinate of each of the predicted collision kinematics and dynamics curves of the human body parts represents a collision kinematics and dynamics parameter of a corresponding human body part.

Specifically, there may be a plurality of predicted collision kinematics and dynamics curves of the human body parts. Each of the predicted collision kinematics and dynamics curves of the human body parts corresponds to one specific part of the human body. There are two types of predicted collision kinematics and dynamics curves of the human body parts, one is a predicted collision kinematics curve, and the other is a predicted collision dynamics curve. For example, the predicted collision kinematics curve may be a head collision kinematics curve, or a chest collision kinematics curve. The predicted collision dynamics curve may be a leg collision dynamics curve. Therefore, the plurality of predicted collision kinematics and dynamics curves of the human body parts may include the head collision kinematics curve, the chest collision kinematics curve, and the leg collision dynamics curve.

The abscissa of the head collision dynamics curve represents the TTC, and the ordinate of the head collision dynamics curve represents the head collision acceleration. The abscissa of the chest collision dynamics curve represents the TTC, and the ordinate of the chest collision dynamics curve represents the chest collision acceleration. The abscissa of the leg collision dynamics curve represents the TTC, and the ordinate of the leg collision dynamics curve represents a leg axial force. It may be understood that, after the steps S100 to S400 are performed, the plurality of predicted collision kinematics and dynamics curves of the human body parts may be obtained, and each of the predicted collision kinematics and dynamics curves corresponds to one human body part.

Figure 3:
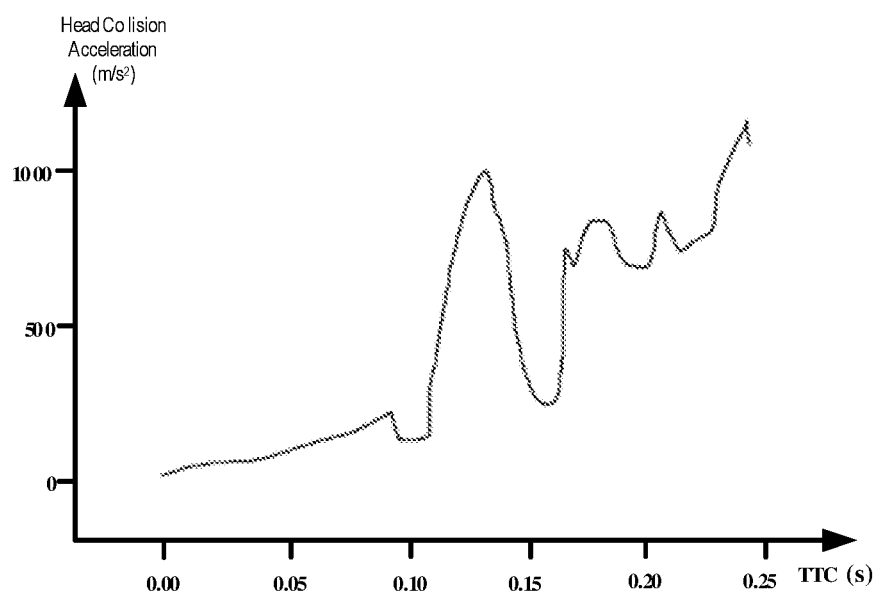
FIG. 3 is a schematic diagram showing a head collision dynamics curve involved in the method for predicting collision severity according to an embodiment of the present disclosure.

FIG. 3 is a schematic diagram showing a head collision dynamics curve in the method for predicting collision severity according to an embodiment of the present disclosure. As shown in FIG. 3, the abscissa of the head collision dynamics curve in FIG. 3 represents the TTC, and the ordinate thereof represents the head collision acceleration.

At step S500, a collision severity parameter is generated according to the plurality of predicted collision kinematics and dynamics curves of the human body parts. The collision severity parameter is configured to evaluate the collision severity.

Specifically, the collision severity parameter is converted from the plurality of predicted collision kinematics and dynamics curves of the human body parts. It should be understood that the collision severity parameter is determined by the plurality of predicted collision dynamics and kinematics curves of the human body parts during the collision. The collision severity parameter is configured to evaluate the collision severity of the vehicle to be predicted in the planned trajectory.

In this embodiment, by establishing the first learning model and inputting the vehicle data and the collision scene feature data into the first learning model to obtain the collision acceleration curve, the road traffic conditions of corresponding road section and the vehicle data may be fully used to calculate the vehicle collision acceleration. By establishing the second learning model, and by inputting the occupant feature data, the restraint system feature data and the collision acceleration curve into the second learning model to obtain the plurality of predicted dynamics and kinematics curves of different parts of the human body, the actual collision accident scene features such as the occupant features and the restraint system features may be comprehensively considered, thereby greatly improving the reliability of the collision severity prediction for the occupant. Finally, based on the predicted collision dynamics and kinematic curves of different human body parts, the injury grade score of each part is calculated to realize the quantification of the collision severity. The method for predicting collision severity involved in the present disclosure may realize a fast and accurate collision severity prediction for the occupant under the premise of considering comprehensive factors. In addition, the method for predicting collision severity involved in the present disclosure may be applied to existing trajectory planning algorithms of intelligent vehicles, so as to improve the accuracy of the collision risk prediction, thereby improving road traffic safety.

In an embodiment of the present disclosure, the step S100 includes the following steps S110 to S120:

At step S110, the vehicle data and the collision accident scene feature data are obtained.

Specifically, the vehicle data may be stored in a local memory of the vehicle to be predicted when the vehicle to be predicted leaves the factory. When the step S110 is executed, the processor in the device for predicting collision severity automatically retrieves the vehicle data stored in the local memory of the vehicle to be predicted. When an alternative road is selected, and the collision severity is being predicted based on the alternative road and the vehicle to be predicted, the vehicle data of the vehicle to be predicted should be obtained firstly. Secondly, the collision accident scene feature data of the alternative road needs to be obtained. The collision accident scene feature data includes one or more of the collision angles, the relative vehicle collision speed, the driving road conditions, the surrounding vehicle type, and the collision recurrence rate. The vehicle data are divided into three groups: first vehicle data configured to train the first learning model, second vehicle data configured to validate a trained first learning model, and third vehicle data configured to predict a collision acceleration curve. The collision accident scene feature data are divided into three groups: first collision accident scene feature data configured to train the first learning model, second collision accident scene feature data configured to validate a trained first learning model, and third collision accident scene feature data configured to predict a collision acceleration curve.

The acquisition modes of the collision accident scene feature data may be various. For example, the driving road conditions may be obtained by a camera arranged on the alternative road, and the relative vehicle collision speed may be acquired by the vehicle radar.

At step S120, the first learning model is established according to the first vehicle data and the first collision accident scene feature data. Further, the third vehicle data and the third collision accident scene feature data are inputted into the first learning model.

Specifically, the first learning model is a machine learning model. The model needs to be pre-trained by inputting original data. It can be understood that the first learning model needs to be established according to the first vehicle data and the first collision accident scene feature data. After being trained, the first learning model needs to be validated according to the second vehicle data and the second collision accident scene feature data. Only after the first learning model is validated, can it be used actually. Further, during application of the first learning model, the third vehicle data and the third collision accident scene feature data are inputted to the first learning model. Because the first learning model has been trained well, there is a comparatively small error between the predicted collision acceleration curve output and the collision acceleration curve during the actual accident.

In this embodiment, by establishing the first learning model according to the first vehicle data and the first collision accident scene feature data, the predicted collision acceleration curve is outputted, so that the outputted predicted collision acceleration curve includes the road traffic conditions of the road section and the data of the vehicle itself, the outputted result has a comparatively high reliability.

In an embodiment of the present disclosure, the step S120 includes the following steps S121 to S124.

At step S121, a first simulation data base is established, according to the first vehicle data and the first collision accident scene feature data and based on a dynamics simulation algorithm.

Specifically, the steps S121 to S124 mainly include two parts, one part includes the steps S121 to S123, and relates to a training and validating process of the first learning model. The other part includes the step S124, and relates to an actual application process of the first learning model.

At step S122, the first learning model is established. Further, the first learning model is trained according to the first simulation data base. The model parameters of the first learning model are continuously adjusted to minimize a loss function of the first learning model, to obtain the trained first learning model.

Specifically, in order to make the error of the predicted collision acceleration curve outputted by the first learning model small enough to conform to the real situation much more, the first learning model needs to be trained. The specific training is to continuously adjust the model parameters of the first learning model to minimize the loss function of the first learning model.

At step S123, the accuracy of the trained first learning model is validated according to the second vehicle data and the second collision accident scene feature data. If the accuracy of the trained first learning model is greater than a first preset accuracy, it is determined that the trained first learning model is qualified.

Specifically, the preset accuracy may be manually configured. The preset accuracy may be measured by a percentage. If the accuracy of the trained first learning model is less than or equal to the first preset accuracy, return to the step S122, and continue to train the trained first learning model until the accuracy of the trained first learning model is greater than the first preset accuracy. Then the subsequent step S124 is performed.

At step S124, the third vehicle data and the third collision accident scene feature data are inputted into the trained first learning model.

Specifically, the accuracy of the trained first learning model is greater than the first preset accuracy, and the comparatively small error, between the outputted predicted collision acceleration curve and the collision acceleration curve during an actual accident, may be realized. At this time, the trained first learning model is used, and the third vehicle data and the third collision accident scene feature data are inputted into the trained first learning model.

In the embodiment, by training the first learning model and validating the accuracy of the first learning model, the comparatively small error, between the predicted collision acceleration curve outputted by the first learning model and the collision acceleration curve during the actual accident, may be achieved, so as to provide a guarantee for the accuracy of the collision severity parameter obtained subsequently.

In an embodiment of the present disclosure, the step S300 includes the following steps S310 to S320.

At step S310, the occupant feature data and the restraint system feature data are obtained.

Specifically, the occupant feature data include the feature data of the occupant taking the vehicle to be predicted. The occupant feature data may be pre-stored in the memory of the device for predicting collision severity. When the step S310 is performed, the processor of the device for predicting collision severity may directly retrieve the occupant feature data to perform subsequent steps. The occupant feature data may include one or more of the occupant's gender, the occupant's age, the occupant's weight and the seated occupant's posture.

The restraint system feature data represent the configuration of the restraint system in the vehicle to be predicted. The restraint systems include a seat belt, a seat, a windshield, and an airbag, etc. Whether the restraint system is correctly configured, and the configuration mode of the restraint system, both will have an impact on the collision severity parameter. Having the same principle as the occupant feature data, the restraint system feature data may also be pre-stored in the memory of the device for predicting collision severity. The occupant feature data are divided into three groups: first occupant feature data configured to train the second learning model, second occupant feature data configured to validate a trained second learning model, and third occupant feature data configured to predict collision kinematics and dynamics curves of human parts. The restraint system feature data are divided into three groups: first restraint system feature data configured to train the second learning model, second restraint system feature data configured to validate the trained second learning model, and third restraint system feature data configured to predict the collision kinematics and dynamics curves of the human parts. When the step S310 is executed, the processor of the device for predicting collision severity may directly retrieve the restraint system feature data.

At step S320, the second learning model is established according to the first occupant feature data and the first restraint system feature data. Further, the predicted collision acceleration curve, the third occupant feature data and the third restraint system feature data are inputted into the second learning model.

Specifically, the second learning model is similar to the first learning model, and is also a model needing to be trained. It can be understood that the principle of the step S320 is similar to that of the step S120, and is not described repeatedly herein.

In this embodiment, by establishing the second learning model based on the first occupant feature data and the first restraint system feature data, the predicted collision kinematics and dynamics curves of the human body parts are outputted, so that the outputted predicted collision kinematics and dynamics curves of the human body parts include the occupant feature data and restraint system feature data, and the outputted results are highly reliable.

In an embodiment of the present disclosure, the step S320 includes the following steps S321 to S324:

At step S321, a second simulation data base is established according to the predicted collision acceleration curve, the first occupant feature data and the first restraint system feature data, and based on the dynamics simulation algorithm.

Specifically, the principle of the step S321 is similar to that of the step S121, and is not described repeatedly herein.

At step S322, the second learning model is established. Further, the second learning model is trained according to the second simulation data base. The model parameters of the second learning model are continuously adjusted to minimize the loss function of the second learning model, to obtain the trained second learning model.

Specifically, the principle of the step S322 is similar to that of the step S122, and is not described repeatedly herein.

At step S323, an accuracy of the trained second learning model is validated according to the second occupant feature data and the second restraint system feature data. If the accuracy of the trained second learning model is greater than a second preset accuracy, it is determined that the trained second learning model is qualified.

Specifically, the principle of the step S323 is similar to that of the step S123, and is not described repeatedly herein.

At step S324, the third predicted collision acceleration curve, the third occupant feature data and the third restraint system feature data are inputted into the trained second learning model.

Specifically, the principle of the step S324 is similar to that of the step S124, and is not descried repeatedly herein.

In this embodiment, by training the second learning model and validating the accuracy of the trained second learning model, the comparatively small error, between the predicted collision kinematics and dynamics curve of the human body parts outputted by the second learning model and the collision kinematics and dynamics curve of the human body parts during the actual accident, can be achieved, thus providing a guarantee for the accuracy of the collision severity parameter obtained subsequently.

In an embodiment of the present disclosure, the first learning model is a machine learning model, and the second learning model is a deep learning model.

Specifically, types of the first learning model and the second learning model may not be limited. Optionally, the first learning model is the machine learning model, and the second learning model is the deep learning model.

In this embodiment, the first learning model is configured to be the machine learning model, and the second learning model is configured to be the deep learning model, which may realize a fast and accurate quantized prediction of collision severity, and compared with the dynamics calculation method, the embodiment has the advantages of low calculation and simple operation.

In an embodiment of the present disclosure, the step S500 includes the following steps.

At step S510, the predicted collision kinematics and dynamics curves of the human body parts each are converted into injury grade scores corresponding to specific parts of the human body.

Specifically, the division principle of injury grade scores may be formulated by a testee. There may be a plurality of injury grades for each specific part of the human body, and each injury grade may be defined by an injury grade score. Optionally, injury grade scores may be increased according to the injury severity from mild injury to severe injury. For example, head injuries may be divided into 6 grades, and one point defines the 1st grade, two points defines the 2nd grade, three points defines the 3rd grade, and the like, till six points defines the 6th grade. The higher the injury grade score, the more seriously the testee may be injured.

In this embodiment, the predicted collision kinematics and dynamics curves of the human body parts each are a vector, that is, each node of the TTC corresponds to a collision kinematics and dynamics parameter of the human body part. However, the collision kinematics and dynamics parameters of the human body part are too numerous to wholly predict the collision severity of the human body part of the testee. Therefore, the predicted collision kinematics and dynamics curves corresponding to human body parts each need to be converted into a scalar quantity. The injury grade scores are the converted scalar quantities. The specific conversion method may not be limited.

In this embodiment, by converting the collision kinematics and dynamics curves of different parts of the human body into the scalar quantities, the quantification of the collision severity of the different parts of the human body is realized, thereby making it convenient to predict and calculate the overall collision severity.

In an embodiment of the present disclosure, the step S500 further includes following steps.

At step S520, the collision severity is wholly evaluated according to the injury grade scores of different specific parts of the human body, and the collision severity parameter is generated.

Specifically, by executing the step S510, only the scalar quantities of evaluations of the collision severity of different parts, namely, injury grade scores corresponding to different specific parts of the human body, are obtained. However, no scalar quantity of the overall evaluation of the collision severity of the testee is obtained. Therefore, it is necessary to process the injury grade scores corresponding to the specific parts of the human body, to generate the collision severity parameter, thereby realizing the overall evaluation of the collision severity.

In the embodiment, by generating the collision severity parameter according to injury grade scores of different specific parts of the human body, the overall evaluation of the collision severity is realized, and the prediction result of the collision severity is unique and accurate.

In an embodiment of the present disclosure, the step S520 includes the following steps.

At step S521, a maximum score among the injury grade scores of different specific parts of the human body is selected as the collision severity parameter.

Specifically, the step S521 describes a mode for generating the collision severity parameter according to the injury grade scores of different specific parts of the human body. This mode is to select the maximum score among the injury grade scores of different specific parts of the human body as the collision severity parameter.

In this embodiment, by selecting the maximum score among the injury grade scores corresponding to the different specific parts of the human body as the collision severity parameter, the calculation method is comparatively simple and is representative. In addition, the collision severity parameter is obtained by converting the plurality of predicted collision kinematics and dynamics curves of the human body parts, and includes several factors, such as the vehicle data, the collision accident scene feature data, the occupant feature data, and the restraint system feature data, which are generated during an actual vehicle collision, the result is more reliable and conforms to the actual vehicle collision much more.

In an embodiment of the present disclosure, the step S520 includes the following steps S522 to S524.

At step S522, the injury grade scores of different specific parts of the human body are sorted in a descending order, and the largest injury grade score is ranked first.

Specifically, the steps S522 to S526 describes another mode of generating the collision severity parameter according to the injury grade scores of the different specific parts of the human body. For example, after the step S510 is performed, the injury grade scores of different parts of the human body may be obtained. Further, the injury grade scores of the different specific parts of the human body are sorted in a descending order, and the largest injury grade score is ranked first.

At step S524, the first three injury grade scores are selected, and squares of the first three injury grade scores are calculated, respectively, to obtain the square of the first injury grade score, the square of the second injury grade score, and the square of the third injury grade score.

For example, after sorted, the three largest injury grade scores are a head injury grade score of 6, a leg injury grade score of 5, and a chest injury grade score of 4. In this step, the squares of the three injury grade scores are calculated respectively, and the square of the head injury grade score is 36, the square of the leg injury grade score is 25, and the square of the chest injury grade score is 16.

At step S526, a sum of the square of the first injury grade score, the square of the second injury grade score, and the square of the third injury grade score is calculated, to obtain the collision severity parameter.

Specifically, following the example at step S524 above, the sum of the square of 36 of the head injury grade score, the square of 25 of the leg injury grade score, and the square of 16 of the chest injury grade score is calculated, to obtain the collision severity parameter of 77. So far, through the method for predicting collision severity provided by the present disclosure, the collision severity parameter namely the scalar quantity evaluating the collision severity, is obtained.

In this embodiment, the sum of the squares of the injury grade scores corresponding to the specific parts of the human body injured severely is calculated, and the sum is used as the collision severity parameter, so that the collision severity parameter may fully cover several human body parts having comparatively high injury severity, and the evaluation is comprehensive. In addition, the collision severity parameter is obtained by converting the plurality of predicted collision kinematics and dynamics curves of the human body parts, and includes several factors, such as the vehicle data, the collision accident scene feature data, the occupant feature data, and the restraint system feature data, which are generated during the actual vehicle collision. The result is more reliable and conforms to the actual vehicle collision much more.

The present application also provides a system for predicting collision severity. The system for predicting the collision severity includes a parameter acquiring module, a learning model establishing module, and a judgement outputting module.

The parameter acquiring module is configured to acquire vehicle data, collision accident scene feature data, occupant feature data, and restraint system feature data.

The learning model establishing module is configured to establish a first learning model and a second learning model.

Specifically, a using method of the first learning model is as follows: the vehicle data and the collision accident scene feature data are inputted into the first learning model, and the predicted collision acceleration curve is outputted by the first learning model. The predicted collision acceleration curve is established based on a plane rectangular coordinate system. The abscissa of the predicted collision acceleration curve presents a Time To Collision (TTC). The ordinate of the predicted collision acceleration curve represents the collision acceleration.

Specifically, a using method of the second learning model is as follows: the predicted collision acceleration curve, the occupant feature data, and the restraint system feature data are inputted into the second learning model. A plurality of predicted collision kinematics and dynamics curves of the human body parts are outputted by the second learning model. The predicted collision kinematics and dynamics curves of the human body parts are established based on the plane rectangular coordinate system. The abscissa of each of the predicted collision kinematics and dynamics curves of the human body parts represents the TTC. The ordinate of each of the predicted collision kinematics and dynamics curves of the human body parts represents a collision kinematics and dynamics parameter of a corresponding part of the human body.

The judgement outputting module is configured to generate a collision severity parameter according to the plurality of predicted collision kinematics and dynamics curves of the human body parts, and to evaluate and output the collision severity based on the collision severity parameter.

The present application also provides a computer device including a memory and a processor. The memory stores a computer program, and when executing the computer program, the processor performs the steps of any one of the methods described above.

The present application also provides a non-volatile computer-readable storage medium, on which a computer program is stored. When executed by a processor, the computer program executes the steps of any one of the methods described above.

The technical features of the embodiments above may be combined arbitrarily. For the sake of brevity, not all possible combinations of the technical features in the embodiments above are described. However, as long as there is no contradiction between the combinations of these technical features, all combinations should be within the scope described in this specification.

The above embodiments are only several embodiments of the present disclosure, and they are specific and detailed, but should not be understood to limit the scope of the present disclosure. It should be noted that various deformations and improvements may be made by those skilled in the art without departing from the concept of the present disclosure, and these deformations and improvements are all within the protection scope of the present disclosure. Accordingly, the protection scope of the present disclosure shall be subject to the appended claims.

What is claimed is:

1. A device for predicting collision severity, comprising a processor, a memory and a plurality of sensors,
and configured to, at an interval of a preset time period, execute:
establishing a first learning model, and inputting vehicle data and collision accident scene feature data into the first learning model;

obtaining a predicted collision acceleration curve outputted by the first learning model, the predicted collision acceleration curve being established based on a plane rectangular coordinate system, an abscissa of the predicted collision acceleration curve presenting a Time To Collision (TTC), and an ordinate of the predicted collision acceleration curve representing the collision acceleration;

establishing a second learning model, and inputting the predicted collision acceleration curve, the occupant feature data and the restraint system feature data into the second learning model;

obtaining a plurality of predicted collision kinematics and dynamics curves of human body parts outputted by the second learning model;

the plurality of predicted collision kinematics and dynamics curves of the human body parts being established based on the plane rectangular coordinate system, an abscissa of each of the plurality of predicted collision kinematics and dynamics curves of the human body parts representing the TTC, a coordinate of each of the plurality of predicted collision kinematics and dynamics curves of the human body parts representing a collision kinematics and dynamics parameter of a corresponding human body part; and converting the plurality of predicted collision kinematics and dynamics curves of the human body parts into injury grade scores corresponding to specific parts of the human body; sorting the injury grade scores of different specific parts of the human body in a descending order, and ranking the largest injury grade score first; selecting the first three injury grade scores, and calculating squares of the first three injury grade scores, respectively, to obtain a square of a first injury grade score, a square of a second injury grade score, and a square of a third injury grade score; calculating a sum of the square of the first injury grade score, the square of the second injury grade score, and the square of the third injury grade score, to obtain the collision severity parameter; and evaluating and outputting the collision severity based on the collision severity parameter.

2. A computer device, comprising a memory and a processor, the memory storing a computer program, wherein, when executing the computer program, the processor performs establishing a first learning model, and inputting vehicle data and collision accident scene feature data into the first learning model;

obtaining a predicted collision acceleration curve outputted by the first learning model, the predicted collision acceleration curve being established based on a plane rectangular coordinate system, an abscissa of the predicted collision acceleration curve presenting a Time To Collision TTC), and an ordinate of the predicted collision acceleration curve representing the collision acceleration;

establishing a second learning model, and inputting the predicted collision acceleration curve, the occupant feature data and the restraint system feature data into the second learning model;

obtaining a plurality of predicted collision kinematics and dynamics curves of human body parts outputted by the second learning model;

the plurality of predicted collision kinematics and dynamics curves of the human body parts being established based on the plane rectangular coordinate system, an abscissa of each of the plurality of predicted collision kinematics and dynamics curves of the human body parts representing the TTC, a coordinate of each of the plurality of predicted collision kinematics and dynamics curves of the human body parts representing a collision kinematics and dynamics parameter of a corresponding human body part; and converting the plurality of predicted collision kinematics and dynamics curves of the human body parts into injury grade scores corresponding to specific parts of the human body; sorting the injury grade scores of different specific parts of the human body in a descending order, and ranking the largest injury grade score first; selecting the first three injury grade scores, and calculating squares of the first three injury grade scores, respectively, to obtain a square of a first injury grade score, a square of a second injury grade score, and a square of a third injury grade score; calculating a sum of the square of the first injury grade score, the square of the second injury grade score, and the square of the third injury grade score, to obtain the collision severity parameter; and evaluating and outputting the collision severity based on the collision severity parameter.

3. The device for predicting the collision severity according to claim 1, wherein:

the vehicle data are divided into three groups: first vehicle data configured to train the first learning model, second vehicle data configured to validate a trained first learning model, and third vehicle data configured to predict a collision acceleration curve; and the collision accident scene feature data are divided into three groups: first collision accident scene feature data configured to train the first learning model, second collision accident scene feature data configured to validate the trained first learning model, and third collision accident scene feature data configured to predict the collision acceleration curve.

4. The device for predicting the collision severity according to claim 3, wherein the establishing the first learning model, and inputting the vehicle data and the collision accident scene feature data into the first learning model comprise:

obtaining the vehicle data and the collision accident scene feature data;

establishing the first learning model according to first vehicle data and first collision accident scene feature data, and inputting third vehicle data and third collision accident scene feature data into the first learning model.

5. The device for predicting the collision severity according to claim 4, wherein establishing the first learning model according to the first vehicle data and the first collision accident scene feature data, and inputting the third vehicle data and the third collision accident scene feature data into the first learning model comprise:

establishing a first simulation data base according to the first vehicle data and the first collision accident scene feature data and based on a dynamics simulation algorithm;

establishing the first learning model, and training the first learning model according to the first simulation data base, continuously adjusting model parameters of the first learning model to minimize a loss function of the first learning model to obtain a trained first learning model;

validating an accuracy of the trained first learning model according to second vehicle data and second collision accident scene feature data, and if the accuracy of the trained first learning model is greater than a first preset accuracy, determining that the trained first learning model is qualified;

inputting the third vehicle data and the third collision accident scene feature data into the trained first learning model.

6. The device for predicting the collision severity according to claim 1, wherein:

the occupant feature data are divided into three groups: first occupant feature data configured to train the second learning model, second occupant feature data configured to validate a trained second learning model, and third occupant feature data configured to predict the collision kinematics and dynamics curves of the human parts;

the restraint system feature data are divided into three groups: first restraint system feature data configured to train the second learning model, second restraint system feature data configured to validate the trained second learning model, and third restraint system feature data configured to predict the collision kinematics and dynamics curves of the human parts.

7. The device for predicting the collision severity according to claim 6, wherein the establishing the second learning model, and inputting the predicted collision acceleration curve, the occupant feature data and the restraint system feature data into the second learning model comprise:

obtaining the occupant feature data and the restraint system feature data;

establishing the second learning model according to first occupant feature data and first restraint system feature data, and inputting the predicted collision acceleration curve, third occupant feature data and third restraint system feature data into the second learning model.

8. The device for predicting the collision severity according to claim 7, wherein establishing the second learning model according to the first occupant feature data and the first restraint system feature data, and inputting the predicted collision acceleration curve, the third occupant feature data and the third restraint system feature data into the second learning model comprise:

establishing a second simulation data base according to the predicted collision acceleration curve, the first occupant feature data and the first restraint system feature data, and based on the dynamics simulation algorithm;

establishing the second learning model, training the second learning model according to the second simulation data base, and continuously adjusting model parameters of the second learning model to minimize a loss function of the second learning model to obtain the trained second learning model;

validating an accuracy of the trained second learning model according to the second occupant feature data and the second restraint system feature data, if the accuracy of the trained second learning model is greater than a second preset accuracy, determining that the trained second learning model is qualified;

inputting the predicted collision acceleration curve, the third occupant feature data and the third restraint system feature data into the trained second learning model.

9. The device for predicting the collision severity according to claim 1, wherein the first learning model is a machine learning model, and the second learning model is a deep learning model.

10. The device for predicting the collision severity according to claim 1, wherein the plurality of predicted collision kinematics and dynamics curves of the human body parts comprise a predicted collision kinematics curve, a predicted collision dynamics curve, or a combination of the predicted collision kinematics curve and the predicted collision dynamics curve.

11. The device for predicting the collision severity according to claim 3, wherein:

the vehicle data comprise at least vehicle type data and vehicle structure data; and the collision accident scene feature data comprise one or more of a collision angle, a relative vehicle collision speed, driving road conditions, driving weather conditions, a surrounding vehicle type, and a collision recurrence rate.

12. The device for predicting the collision severity according to claim 6, wherein:

the occupant feature data comprises one or more of an occupant's gender, an occupant's age, an occupant's weight, and a seated occupant's posture; and the restraint systems comprise one or more of a seat belt, a seat, a windshield, and an airbag.

* * * * *